(12) United States Patent
Teramoto

(10) Patent No.: US 7,547,915 B2
(45) Date of Patent: *Jun. 16, 2009

(54) SEMICONDUCTOR DEVICE HAVING SIOXNY FILM

(75) Inventor: Satoshi Teramoto, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/891,052

(22) Filed: Jul. 15, 2004

(65) Prior Publication Data

US 2004/0262606 A1    Dec. 30, 2004

Related U.S. Application Data

(60) Division of application No. 09/019,295, filed on Feb. 5, 1998, now Pat. No. 6,867,432, which is a continuation of application No. 08/460,275, filed on Jun. 2, 1995, now abandoned.

(30) Foreign Application Priority Data

Jun. 9, 1994   (JP) .................................... 6-151698

(51) Int. Cl.
    *H01L 29/04* (2006.01)
(52) U.S. Cl. ............................. 257/59; 257/61; 257/72; 349/43; 349/46
(58) Field of Classification Search ............. 257/639, 257/288, 411, 59
    See application file for complete search history.

(56) References Cited

U.S. PATENT DOCUMENTS

| 4,214,919 A | 7/1980 | Young |
| 4,468,855 A | 9/1984 | Sasaki |
| 4,534,820 A | 8/1985 | Mori et al. |
| 4,565,584 A | 1/1986 | Tamura et al. |
| 4,575,925 A | 3/1986 | Kanbara et al. |
| 4,592,799 A | 6/1986 | Hayafuji |

(Continued)

FOREIGN PATENT DOCUMENTS

EP    0 222 215    5/1987

(Continued)

OTHER PUBLICATIONS

Stanley Wolf Ph.D. et al., *Silicon Processing For the VLSI Era*, vol. 1: Process Technology, pp. 175-177, Jan. 1, 1986.

(Continued)

*Primary Examiner*—Jerome Jackson, Jr.
*Assistant Examiner*—Jose R Diaz
(74) *Attorney, Agent, or Firm*—Eric J. Robinson; Robinson Intellectual Property Law Office, P.C.

(57) ABSTRACT

In fabricating a thin film transistor, an active layer comprising a silicon semiconductor is formed on a substrate having an insulating surface. Hydrogen is introduced into The active layer. A thin film comprising $SiO_xN_y$ is formed to cover the active layer and then a gate insulating film comprising a silicon oxide film formed on the thin film comprising $SiO_xN_y$. Also, a thin film comprising $SiO_xN_y$ is formed under the active layer. The active layer includes a metal element at a concentration of $1\times10^{15}$ to $1\times10^{19}$ cm$^{-3}$ and hydrogen at a concentration of $2\times10^{19}$ to $5\times10^{21}$ cm$^{-3}$.

26 Claims, 5 Drawing Sheets

U.S. PATENT DOCUMENTS

| | | | |
|---|---|---|---|
| 4,633,284 | A | 12/1986 | Hansell et al. |
| 4,656,101 | A | 4/1987 | Yamazaki |
| 4,727,044 | A | 2/1988 | Yamazaki |
| 4,772,927 | A | 9/1988 | Saito et al. |
| 4,782,037 | A | 11/1988 | Tomozawa et al. |
| 4,851,363 | A | 7/1989 | Troxell et al. |
| 4,905,066 | A * | 2/1990 | Dohjo et al. ............... 257/60 |
| 5,040,037 | A | 8/1991 | Yamaguchi et al. |
| 5,108,843 | A | 4/1992 | Ohtaka et al. |
| 5,130,772 | A | 7/1992 | Choi |
| 5,147,826 | A | 9/1992 | Liu et al. |
| 5,148,248 | A * | 9/1992 | Possin et al. ............... 257/356 |
| 5,164,805 | A | 11/1992 | Lee |
| 5,166,816 | A * | 11/1992 | Kaneko et al. ............... 257/59 |
| 5,210,050 | A | 5/1993 | Yamazaki et al. |
| 5,236,850 | A | 8/1993 | Zhang |
| 5,254,208 | A | 10/1993 | Zhang |
| 5,270,567 | A | 12/1993 | Mori et al. |
| 5,275,851 | A | 1/1994 | Fonash et al. |
| 5,294,238 | A | 3/1994 | Fukada et al. |
| 5,306,651 | A | 4/1994 | Masumo et al. |
| 5,311,040 | A | 5/1994 | Hiramatsu et al. |
| 5,313,075 | A | 5/1994 | Zhang et al. |
| 5,508,532 | A * | 4/1996 | Teramoto ............... 257/59 |
| 5,523,240 | A | 6/1996 | Zhang et al. |
| 5,529,937 | A | 6/1996 | Zhang et al. |
| 5,531,182 | A | 7/1996 | Yonehara |
| 5,563,426 | A | 10/1996 | Zhang et al. |
| 5,569,936 | A | 10/1996 | Zhang et al. |
| 5,665,210 | A | 9/1997 | Yamazaki |
| 5,696,003 | A * | 12/1997 | Makita et al. ............... 438/166 |
| 5,716,857 | A | 2/1998 | Zhang |
| 5,731,613 | A | 3/1998 | Yamazaki et al. |
| 5,783,842 | A | 7/1998 | Kohchi et al. |
| 6,265,249 | B1 * | 7/2001 | Wu ............... 438/158 |
| 6,429,483 | B1 * | 8/2002 | Teramoto ............... 257/347 |
| 6,853,002 | B2 * | 2/2005 | Yamazaki et al. ............... 257/59 |
| 2002/0058394 | A1 * | 5/2002 | Holmes et al. ............... 438/398 |

FOREIGN PATENT DOCUMENTS

| | | |
|---|---|---|
| EP | 0 390 608 | 10/1990 |
| EP | 0 459 763 | 12/1991 |
| EP | 0 532 314 | 3/1993 |
| GB | 2 199 987 | 7/1988 |
| JP | 58-93273 | 6/1983 |
| JP | 58-164268 | 9/1983 |
| JP | 58-182243 | 10/1983 |
| JP | 59-028327 | 2/1984 |
| JP | 59-065479 | 4/1984 |
| JP | 59-126673 | 7/1984 |
| JP | 59-182517 | 10/1984 |
| JP | 61-063017 | 4/1986 |
| JP | 61-78119 | 4/1986 |
| JP | 62-030314 | 2/1987 |
| JP | 62-104117 | 5/1987 |
| JP | 62-147759 | 7/1987 |
| JP | 63-190386 | 8/1988 |
| JP | 63-240524 | 10/1988 |
| JP | 64-035961 | 2/1989 |
| JP | 64-35961 | 2/1989 |
| JP | 64-47076 | 2/1989 |
| JP | 1-128515 | 5/1989 |
| JP | 1-196116 | 8/1989 |
| JP | 1-276672 | 11/1989 |
| JP | 01-276672 | 11/1989 |
| JP | 2-44022 | 2/1990 |
| JP | 02-140915 | 5/1990 |
| JP | 02-222546 | 9/1990 |
| JP | 03-029316 | 2/1991 |
| JP | 03-095939 | 4/1991 |
| JP | 3-112089 | 5/1991 |
| JP | 03-185736 | 8/1991 |
| JP | 04-037168 | 2/1992 |
| JP | 04-111361 | 4/1992 |
| JP | 04-165679 | 6/1992 |
| JP | 05-055581 | 3/1993 |
| JP | 05-175506 | 7/1993 |
| JP | 06-013610 | 1/1994 |
| JP | 06-097073 | 4/1994 |
| JP | 06-112490 | 4/1994 |
| JP | 06-163401 | 6/1994 |
| JP | 07-161996 | 6/1995 |

OTHER PUBLICATIONS

K. Haberle et al., *Electrical Properties and Structure of Boron-Doped Sputter-Deposited Polycrystalline Silicon Films*, Thin Solid Films, vol. 61, Jan. 1, 1979, pp. 105-113.

R. A. Lemons et al., *Laser Crystallization of Si Films on Glass*, Appl. Phys. Lett. 40(6), Mar. 15, 1982, pp. 469-471.

Kenji Nakazawa et al., *Low Temperature Thin Film Transistor Fabrication Using a Polycrystalline Silicon Film Formed from a Fluorinated Silicon Film*, Extended Abstracts of the 20th (1988) Int. Conf. on Solid State Devices and Materials, Tokyo, Aug. 24, 1988, pp. 619-620.

Brodsky et al., *Doping of Sputtered Amorphous Semiconductor*, IBM Technical Disclosure Bulletin, May 1977, vol. 19, No. 12, pp. 4802-4803.

Hiroshi Kanoh et al., *Amorphous-Silicon/Silicon-Nitride Thin-Film Transistors Fabricated by Plasma-Free (Chemical Vapor Deposition) Method*, IEEE Electron Device Letters, vol. 11, No. 6, Jun. 1990, pp. 258-260.

S. Suyama et al., *Electrical Conduction Mechanism and Breakdown Properties in Sputter-Deposited Silicon Dioxide Films on Polycrystalline Silicon*, J. Appl. Phys. 65 (1), Jan. 1, 1989, pp. 210-214.

C. Hayzelden et al., "*In Situ Transmission Electron Microscopy Studies of Silicide-Mediated Crystallization of Amorphous Silicon*," Appl. Phys. Lett. 60(2), Jan. 13, 1992, pp. 225-227.

A. V. Dvurechenskii et al., "Transport Phenomena in Amorphous Silicon Doped by Ion Implantation of 3d Metals," *Akademikian Lavrentev Prospekt* 13, 630090 Novosibirsk 90, USSR, pp. 635-640, 1990.

T. Hempel et al., "Needle-Like Crystallization of Ni Doped Amorphous Silicon Thin Films," *Solid State Communications*, vol. 85, No. 11, pp. 921-924, 1993.

"Crystallized Si Films By Low-Temperature Rapid Thermal Annealing of Amorphous Silicon," R. Kakkad, J. Smith, W. S. Lau, S. J. Fonash, J. Appl. Phys. 65 (5), Mar. 1, 1989, 1989 American Institute of Physics, p. 2069-2072.

"Polycrystalline Silicon Thin Film Transistors on Corning 7059 Glass Substrates Using Short Time, Low Temperature Processing," G. Liu, S. J. Fonash, Appl. Phys. Lett. 62 (20), May 17, 1993, 1993 American Institute of Physics, p. 2554-2556.

"Selective Area Crystallization of Amorphous Silicon Films by Low-Temperature Rapid Thermal Annealing," Gang Liu and S. J. Fonash, Appl. Phys. Lett. 55 (7), Aug. 14, 1989, 1989 American Institute of Physics, p. 660-662.

"Low Temperature Selective Crystallization of Amorphous Silicon," R. Kakkad, G. Liu, S. J. Fonash, Journal of Non-Crystalline Solids, vol. 115, (1989), p. 66-68.

Y. Kawazu et al., *Low-Temperature Crystallization of Hydrogenated Amorphous Silicon Induced by Nickel Silicide Formation*, Japanese Journal of Applied Physics, vol. 29, No. 12, Dec. 1990, pp. 2698-2704.

* cited by examiner

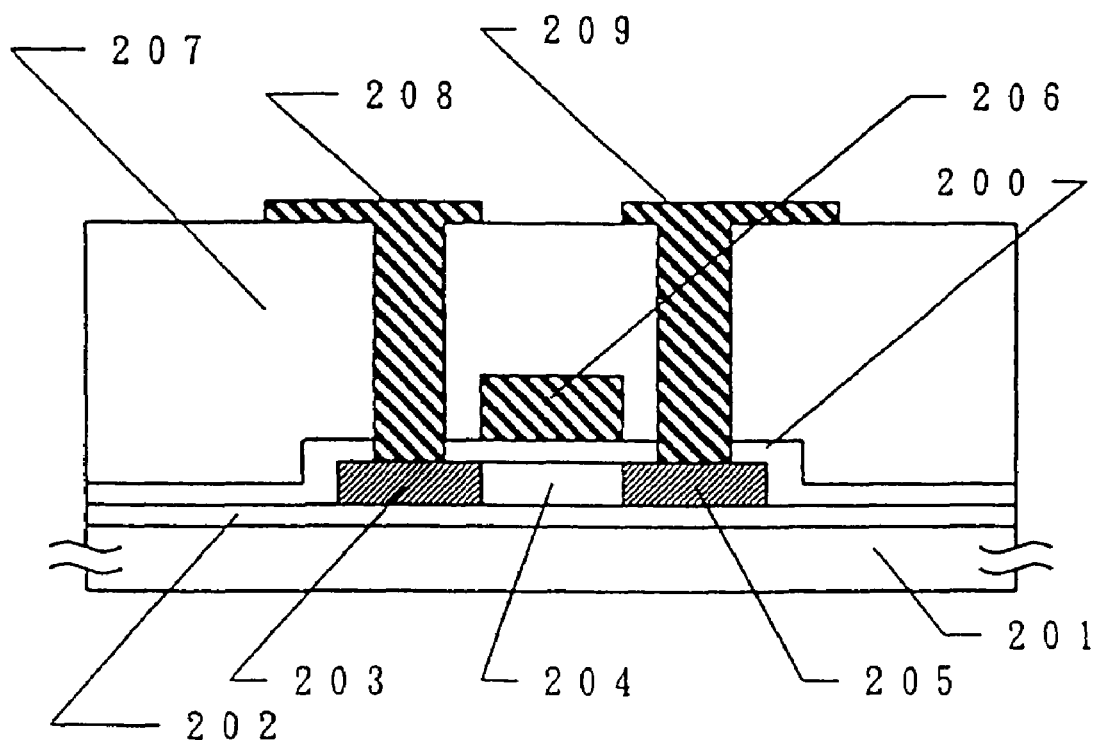

IMPURITY ION IMPLANTATION
AND LASER LIGHT IRRADIATION

SEMICONDUCTOR DEVICE HAVING SIOXNY FILM

BACKGROUND OF THE INVENTION

1. Field of the Invention

The invention disclosed in this specification relates to a structure of a thin film semiconductor device such as a thin film transistor or the like, and a method for fabricating the same.

2. Description of the Prior Art

There is known a structure for obtaining a display device which has a high display function by using a thin film transistor (TFT) in a liquid crystal display, the display substituting a cathode ray tube. This display is referred to as an active matrix type liquid crystal display device. This active matrix type liquid crystal display device is a display in which a thin film transistor is arranged in each of the pixel electrodes arranged in matrix to provide a high function display. To heighten the display function, the characteristics of the thin film transistor is required to be set to as high as possible.

The thin film transistor used in an active matrix type liquid crystal display device has a problem in that the thin film transistor is required to be formed on a glass substrate. In other words, to use the glass substrate as the substrate, there is a problem in that the substrate is limited in the fabrication process. Not only thin film transistors but also semiconductors needs to be heated to a high temperature (for example, of 800 to 1000° C.) out of the necessity of diffusing impurity into silicon, activating impurity in silicon, and improving the crystallinity of silicon. However, the temperature that can be applied to the glass substrate is generally about 600° C., and various new techniques are required to fabricate a high performance semiconductor device at a temperature level below this. For example, there are such techniques as a technique for irradiating an amorphous silicon film with laser light to crystallize the amorphous silicon film, and a technique for using the laser light irradiation for the diffusion and activation of the impurity. Since the technique for laser light irradiation causes an extremely small thermal damage to the glass substrate, this is an extremely useful technique when the low productivity is permitted.

FIG. 2 is a schematic sectional view of a conventionally known thin film transistor (generally referred to as TFT). What is shown in FIG. 2 is a thin film transistor which functions to prevent the intrusion of impurity into the active layer from the glass substrate. The active layer comprises a source area 203, a channel formation area 204 and a drain area 205. Then, as a gate insulating film 200, a silicon oxide film or a silicon nitride film is formed. A gate electrode 206 comprises a metal and semiconductors. Further, the whole element is covered with an interlayer insulating film 207 which comprises an appropriate insulator such as a silicon oxide film or the like. Further, a source electrode 208 is taken out from the source area 203 while a drain electrode 209 is taken out from the drain area 205.

The active layer comprising the source area 203, the drain area 205 and the channel formation area 204 is formed of crystalline silicon. As the crystalline silicon film, a silicon film formed of the amorphous silicon film crystallized by the laser light irradiation is used. However, there is no technique available for forming a single crystal silicon on the glass substrate. Although the film thus formed has crystallinity, the film has a quality in which a large amount of defects and levels are present. Although the film thus formed has crystallinity, the film has a quality in which defects and levels are present. To reduce the defects and levels in the silicon film, a method for neutralizing a dangling bond (unpaired connectors) of silicon which causes defects and levels by using a hydrogen atom. This holds true of a case in which the active layer is not crystalline silicon and is formed of amorphous silicon.

In this manner, in the silicon semiconductor film formed on the glass substrate, the silicon semiconductor film needs to contain hydrogen. However, when an attempt is made to cause the active layer formed of the silicon semiconductor to contain hydrogen, there is a problem in that hydrogen is diffused into the gate insulating film from the active layer.

On the other hand, in the structure shown in FIG. 2, it is not extremely favorable that mobile ions exist in the gate insulating film, the threshold value varies, and a hysterisis is generated in the C—V characteristics. Consequently, containing hydrogen in the active layer is a useful method on the one hand, it is a disadvantageous method on the other in that hydrogen is diffused in the gate insulating film.

SUMMARY OF THE INVENTION

The invention disclosed in this specification is intended to provide a structure of a semiconductor device wherein the active layer formed of a silicon semiconductor is allowed to contain hydrogen, and the hydrogen does not affect other areas and other parts.

A semiconductor device disclosed in this specification primarily comprises, an active layer formed of a silicon film, and a gate insulating film formed on the active layer, wherein a thin film represented by $SiO_xN_y$ is formed between the aforementioned active layer and the aforementioned gate insulating film.

In the above structure, examples of the silicon film include an amorphous silicon film and a crystalline silicon film. Examples of the crystalline silicon film include a polycrystalline silicon film, a fine crystal silicon film, an amorphous silicon film partially including a crystal structure and a silicon film having a mixture of a crystal structure and an amorphous structure.

The active layer refers to a semiconductor layer constituting a thin film transistor. Generally the thin film transistor comprises a source/drain area with one conductivity-type and a channel formation area. Further, the active layer includes an offset gate area and a light dope area. When the crystalline silicon film is used, it is desirable that the density of hydrogen contained in the active layer is set to 0.001 to 5 atom %.

Further, in the aforementioned structure, either silicon nitride film or silicon oxide film may be adopted as a base film formed under an active layer. Further, as a base film, a thin film transistor represented by $SiO_xN_y$ is further effectively used. A structure for substantially closing hydrogen in the active layer by substantially covering the active layer (in actuality a contact area for the source/drain area is present so that the active layer is not completely covered) with a thin film represented by $SiO_xN_y$ formed as a base film.

Further, in the case where a crystalline silicon film is used which contains a metal element which promotes the crystallization of silicon as a silicon film which constitutes an active layer, it is useful to adopt the aforementioned structure. In other words, to form the crystalline silicon film formed by the metal element which promotes the crystallization into a semiconductor with higher electric properties, the aforementioned structure is adopted at the time of hydrogenation to enable further heightening the effect of the hydrogenation. Needless to say, this effect is extremely useful when hydrogen ions are actively contained in the active layer by hydrogen doping or the like.

Further, in the case where nickel is used as a metal element for promoting the aforementioned crystallization, the effect is even more conspicuous. Further an excess amount of the metal element for promoting the crystallization deteriorates the characteristics of semiconductors (which is approximate to the characteristics of the metal). Excessively small amount of the metal element reduces the effect of promoting the crystallization. Consequently, the most appropriate density is $1 \times 10^{15}$ to $1 \times 10^{19}$ cm$^{-3}$.

As metal elements for promoting the crystallization, such elements as Fe, Co, Ru, Rh, Pd, Os, Ir, Pt, Cu, Ag and Au can be used in addition to Ni. What is important about this element for promoting the crystallization of the amorphous silicon is that the element is an intrusive atom.

The metal element described above diffuses into the silicon film in the heat treatment step. Then the crystallization of silicon proceeds at the same time when the aforementioned element diffuses. In other words, the aforementioned intrusive metal exhibits catalytic action in various places of diffusion to promote the crystallization of the amorphous silicon film.

Besides, since the aforementioned intrusive element soon diffuse into the silicon film, the introduced amount of the element (added amount) becomes very important. In other words, when the introduced amount thereof is small, a favorable crystallinity cannot be obtained. Further, when the introduced amount is too large, the semiconductor characteristics of silicon will be lost.

Consequently, the most appropriate scope of the introduced amount of the aforementioned metal element into the amorphous silicon film becomes important. For example, when nickel is used as a metal element for promoting the aforementioned crystallization, the effect of promoting crystallization can be obtained by introducing nickel element into the amorphous silicon so that the density of the metal element in the crystalline silicon film becomes $1 \times 10^{19}$ cm$^{-3}$ or more. Further, it has been made clear that the semiconductor characteristics are not damaged when the introduced amount of nickel element is controlled so that the density of nickel element becomes $1 \times 10^{19}$ cm$^{-3}$ or less. The density here is defined by the minimum value obtained by the secondary ion mass analysis (SIMS) process.

Further, with respect to a metal element other than the aforementioned nickel, the effect can be obtained in the density scope similar to that of nickel.

In addition to the aforementioned metal element, when Al or Sn is used, the crystallization of the amorphous silicon film can be promoted. However, Al and Sn form an alloy with silicon and will not diffuse into and intrude the silicon film. In such a case, a portion where an alloy is formed with silicon in crystallization constitutes a crystal nucleus, and the crystal growth proceeds from that portion. When Al and Sn are used in this manner, the crystal growth proceeds only from a portion into which Al and Sn are introduced (an alloy layer of these elements and silicon). Consequently, there is a problem in that the crystallinity is generally poor as compared with a case in which an intrusive element such as the aforementioned nickel or the like is used. For example, there is a problem in that it is difficult to obtain a uniformly crystallized crystalline silicon film. Further, there is a problem in that the presence of the alloy layer hinders the fabrication of the device. Further, there is a problem in that the presence of the alloy layer deteriorates the reliability of the device.

With respect to the thin film represented by $SiO_xN_y$, X and y assume a value of $0<x<2$ and $0<y<4/3$ respectively, the dielectric constant assumes 4 to 6, and the band gap assumes 5.3 to 7.0 eV. The thin film represented by $SiO_xN_y$ can be formed by using dichlorosilane ($SiH_2Cl_2$) or ammonia ($NH_4$) and nitrogen monoxide ($N_2O$). In this state, the thin film of $SiO_xN_y$ includes chlorine at a concentration of $1 \times 10^{15}$ to $1 \times 10^{20}$ cm$^{-3}$.

A main structure of another aspect is characterized by comprising the steps of, forming an active layer comprising a silicon semiconductor on a substrate having an insulating surface, forming a thin film represented by $SiO_xN_y$ by covering the aforementioned active layer, and forming a gate insulating film represented by the aforementioned $SiO_xN_y$.

In the aforementioned structure, examples of substrates having an insulating surface include a glass substrate, a semiconductor substrate on which an insulating film is formed, and a conductive substrate on which the insulating film is formed.

In the aforementioned structure the step of forming the silicon semiconductor includes a method for forming an amorphous silicon film by the plasma CVD, the reduced pressure CVD, a method of crystallizing an amorphous silicon film formed by the plasma CVD and the reduced pressure CVD by the laser light irradiation or by heat treatment, and a method of crystallizing an amorphous silicon film formed by the plasma CVD or the reduced pressure CVD by the action of elements which promotes the crystallization of nickel or the like.

A structure of another aspect is characterized by comprising the steps of, forming an active layer comprising a silicon semiconductor on a substrate having an insulating surface, allowing the aforementioned active layer to contain hydrogen, forming a thin film represented by $SiO_xN_y$ by covering the aforementioned active layer, and forming a gate insulating film comprising a silicon oxide film on a thin film represented by the aforementioned $SiO_xN_y$.

In the aforementioned structure, a method of allowing an active layer to contain hydrogen includes such methods as hydrogen ion doping, heat treatment in the atmosphere of hydrogen, and exposure to hydrogen plasma.

In this structure, too, it is useful to use a crystalline silicon film by using a catalyst element which promotes crystallization.

A silicon semiconductor which contains hydrogen or which is allowed to contain hydrogen is used as an active layer. In a structure in which a gate insulating film is present on the active layer, hydrogen in the active layer does not diffuse into the active layer by forming a thin film represented by $SiO_xN_y$ between the active layer and the gate insulating film. Then, a thin film transistor having an excellent electric characteristics and stability can be obtained. Further, a thin film transistor represented by $SiO_xN_y$ is formed by using a chlorosilane and dichlorosilane with the result that a film is allowed to contain chlorine. This chlorine serves to fix mobile ions to heighten the function and stability as a gate insulating film.

Further, by using a thin film represented by $SiO_xN_y$ a structure can be realized wherein an active layer is substantially covered by a thin film represented by $SiO_xN_y$. Then, hydrogen which is contained in the active layer can be closed in the active layer thereby heightening the effect. Further, at the same time, hydrogen in the active layer can be prevented from diffusing to the outside of-the active layer.

A thin film represented by $SiO_xN_y$ not only has a barrier effect with respect to hydrogen ions but also oxygen (O) in the film serves to remove hysterisis in the C—V characteristics. Further, the SiN bond serves to prevent the drift of Na and heavy metals (such as Fe, Ni and Co).

In particular, when the active layer is crystallized by using a metal element such as nickel or the like, the metal element is contained in the active layer. Consequently, it is extremely useful to cover at least an upper surface of the active layer (a surface which contacts the gate insulating film) with a thin film represented by $SiO_xN_y$. In other words, metal elements such as nickel or the like which functions as a mobile ion can be prevented from diffusing into the gate insulating film.

BRIEF DESCRIPTION OF THE DRAWINGS

FIG. 2 shows a structure of a conventional thin film transistor;

DETAILED DESCRIPTION OF PREFERRED EMBODIMENTS

Embodiment 1

FIG. 1 shows an outline of a fabrication step according to Embodiment 1. The thin film transistor shown in embodiment 1 can be used in a switching element arranged in a pixel of an active type liquid crystal display device, a drive circuit constituting a peripheral circuit of the liquid crystal display device, and other thin film integrated circuits.

In this embodiment, a glass substrate is used as the substrate 101. In the beginning, a silicon nitride film 102 is formed to a thickness of 1000 Å on the substrate by the plasma CVD. Here, the silicon nitride film 102 is formed by using the plasma CVD using $SiH_4$ and $NH_4$. In place of the plasma CVD, the low pressure thermal CVD can be used.

Next, the amorphous silicon film is formed to a thickness of 1000 Å by the plasma CVD or the low pressure thermal CVD. Then, heating, the laser light irradiation or a combination of the two results in the crystallization of the amorphous silicon film thereby obtaining a crystalline silicon film. Here, a method is adopted which comprises containing in a solution nickel which is a metal element for promoting the crystallization, and coating the solution on a surface of the amorphous silicon film to introduce a nickel element into an amorphous silicon film.

Specifically, a nickel acetate solution is dripped on the surface of the amorphous silicon film to provide a state in which nickel is held in contact with the amorphous silicon film thereby introducing nickel into the amorphous silicon film. The introduction of these metal elements may be performed by the sputtering process and the plasma CVD. In this manner, in a state in which nickel, a metal element which promotes the crystallization contacts the amorphous silicon film, an amorphous silicon is crystallized with heat treatment. This heat treatment may be performed for four to eight hours at 450 to 550° C. Here, the heat treatment is performed for four hours at 550° C. in the atmosphere of nitrogen.

Figure 1A:
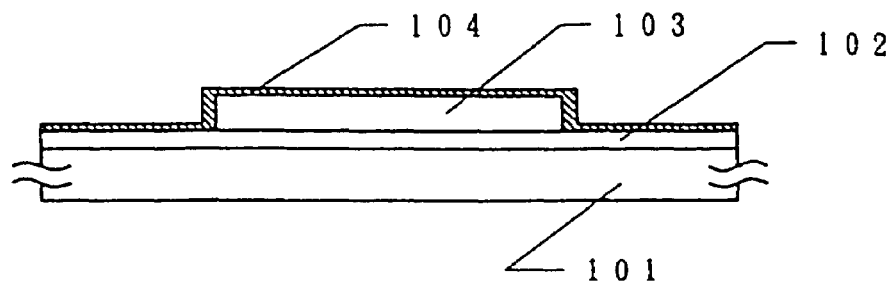
FIGS. 1A to 1C show a fabrication step according to an embodiment.

When a crystalline silicon film is obtained, the film is patterned to form an active layer 103 of a thin film transistor. Thus, the active layer 103 of the thin film transistor is formed. The oxygen density in this active layer is desirably set to $2 \times 10^{19}$ to $5 \times 10^{21}$ $cm^{-3}$. Next, a thin film transistor 104 represented by $SiO_xN_y$ is formed to a thickness of 10 to 100 Å by the plasma CVD. Here, a thin film 104 represented by $SiO_xN_y$ is formed by the plasma CVD using dichlorosilane ($SiH_2Cl_2$) as a material gas. Since the thin film 104 functions as a barrier layer with respect to hydrogen ions, the thin film is required to be fine. Although dichlorosilane is used as a material gas, $SiH_4$, $NH_4$ and $N_2O$ may be used as a material gas. (FIG. 1A)

A silicon oxide film 105 is formed to a thickness of 1000 Å by the plasma CVD or the sputtering process. This silicon oxide film serves as a normal gate insulating film. Then, a gate electrode 106 is formed with a metal and a semiconductor having one conductivity type. Here, the gate electrode 106 by using an N-type crystalline silicon semiconductor heavy-doped with phosphorus.

Figure 1B:
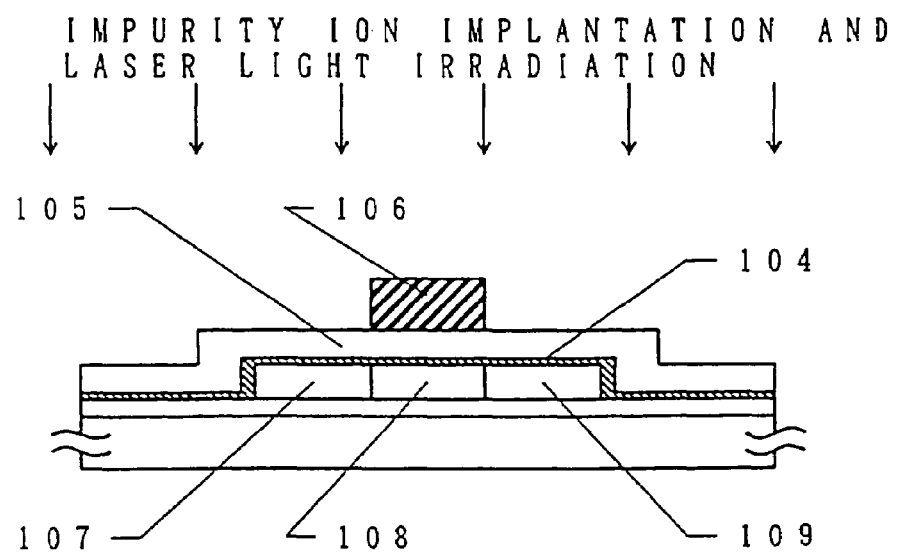
Figure 1C:
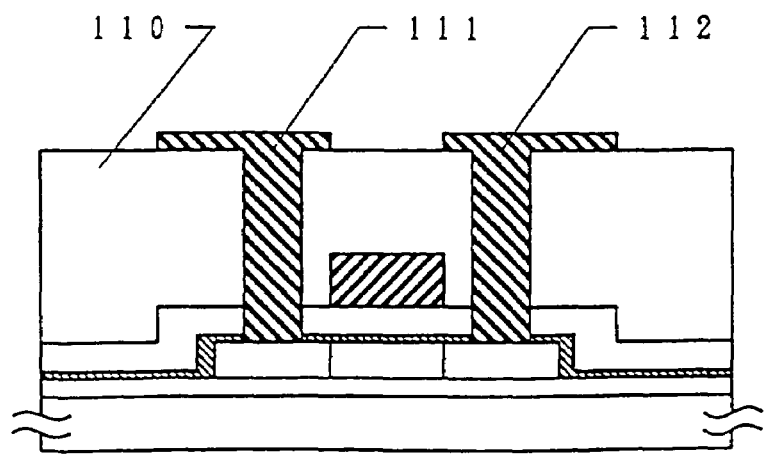

Next, the gate electrode 106 is used for doping phosphorus ions. In this manner, phosphorus ions are doped into areas 107 and 109. The source area 107 and the drain area 109 are formed in self-alignment. Further, at the same time, a channel formation area 108 is formed. After that, the source area 107 and the drain area 109 are activated and the film damaged at the time of ion doping is annealed by the laser light irradiation. (FIG. 1B)

Then, a silicon oxide film 110 is formed as an interlayer insulating film. A source electrode 111, a drain electrode 112 are formed by passing through the hole drilling step thereby completing the thin film transistor shown in FIG. 1C.

With the thin film transistor shown in FIG. 1, since an active layer comprising a source area 107, a drain area 109 and a channel formation area 108 is covered with a $SiO_xN_y$ film, hydrogen in the active layer will not diffuse to the outside. In particular, since the $SiO_xN_y$ film 104 is present between the silicon oxide film constituting a gate insulating film and the active layer, hydrogen will not diffuse into the gate insulating film thereby forming a structure without deterioration in characteristics.

Embodiment 2

FIGS. 3A to 3D show an outline of the fabrication step of embodiment 2. With the thin film transistor shown in embodiment 2, hydrogen is doped into a crystalline silicon semiconductor which constitutes an active layer by the ion doping process or the plasma doping process to allow the active layer to actively contain hydrogen to neutralize an unpaired bond in the active layer. Further, to close doped hydrogen in the active layer, embodiment 2 is characterized by covering the surface of the active layer with the thin film represented by $SiO_xN_y$.

The thin film transistor shown in this embodiment can be used in a switching element arranged in a pixel of an active matrix type liquid crystal display device, a drive circuit constituting a peripheral circuit of the liquid crystal display device and other integrated circuits.

FIG. 3 shows an outline of the fabrication step of embodiment 2. In this embodiment, a glass substrate is used as a substrate 101. In the beginning, a thin film 100 represented by $SiO_xN_y$ is formed to a thickness of 1000 Å as a base film on the glass substrate by the plasma CVD. Here, the thin film 100 is formed by the plasma CVD using dichlorosilane.

Figure 3A:
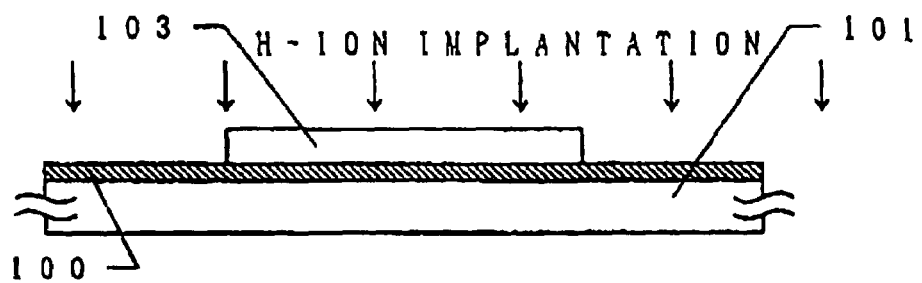
FIGS. 3A to 3D show a fabrication step according to another embodiment.

Next, an amorphous silicon film is formed to a thickness of 1000 Å by the plasma CVD or the low pressure thermal CVD. Then, the amorphous silicon film is crystallized by heating, the laser light irradiation, or a combination thereof to obtain a crystalline silicon film. Here, nickel which is a catalyst element promoting crystallization is introduced into a nickel acetate solution. Specifically, nickel is introduced into the amorphous silicon film by coating nickel acetate solution onto the surface of the amorphous silicon film by the spin coating process. The amorphous silicon is crystallized by four hour heat treatment at 550° C. When the crystalline silicon film is obtained, the film is patterned to obtain an active layer of the thin film transistor. Thus, the active layer 103 of the thin film transistor is formed. (FIG. 3A)

In a state in which the active layer 103 formed of the crystalline silicon is exposed, hydrogen ions are doped. Here, the acceleration voltage is set to 40 KeV and the dose amount is set to $2\times10^{16}$ cm$^{-3}$ for ion doping.

In this manner, hydrogen is contained in the active layer to reduce the level in the active layer. By the way, it is effective to heat treat the active layer at 300 to 500° C.

Figure 3B:
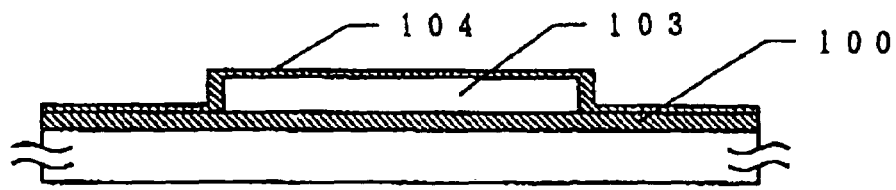

Then, a thin film represented by $SiO_xN_y$ is formed to a thickness of 10 to 100 Å by the plasma CVD. Here, the film is formed by the plasma CVD using dichlorosilane as a material gas. (FIG. 3B)

Next, a silicon oxide film 105 is formed to a thickness of 1000 Å by the plasma CVD or the sputtering process. This silicon oxide film serves as a normal gate insulating film. Then, a material containing aluminum as a primary component is used to form a gate electrode 113 in the anodic oxidation process. Then, an oxide layer 114 is formed at the anodic oxidation step on the periphery of the gate electrode 113 containing aluminum as a primary component. This step is carried out by performing anodic oxidation in an electrolyte solution by using the gate electrode 113 as an anode. Here, the oxide layer 114 is formed to a thickness of about 2000 Å. This oxide layer 114 is used as a mask in the later impurity ion doping step with the result that an offset gate area can be constituted by the portion of the thickness of the oxide layer 114.

Figure 3C:
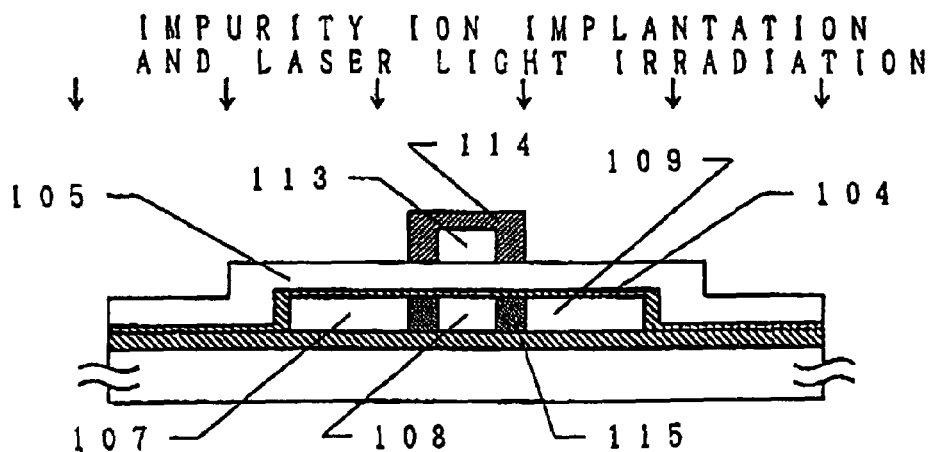

Then, the gate electrode 113 and an oxide layer surrounding the gate electrode 113 are used as a mask for phosphorus ion doping. Thus, phosphorus ions are doped into areas 107 and 109 thereby forming a source area 107 and a drain area 109 in self-alignment. At the same time, a channel formation area 108 is formed. Further, at this step of doping impurity ions, the offset gate area 115 is formed at the same time. Then, the source area 107 and the drain area 109 are activated and the film damaged at the time of ion doping is annealed by the laser light irradiation (FIG. 3C)

Next, a silicon oxide film 110 is formed as an interlayer insulating film 110. After the hole drilling step is carried out, a source electrode 111 and a gate electrode 112 are formed. Thus, a thin film transistor shown in FIG. 3D is completed.

Figure 3D:
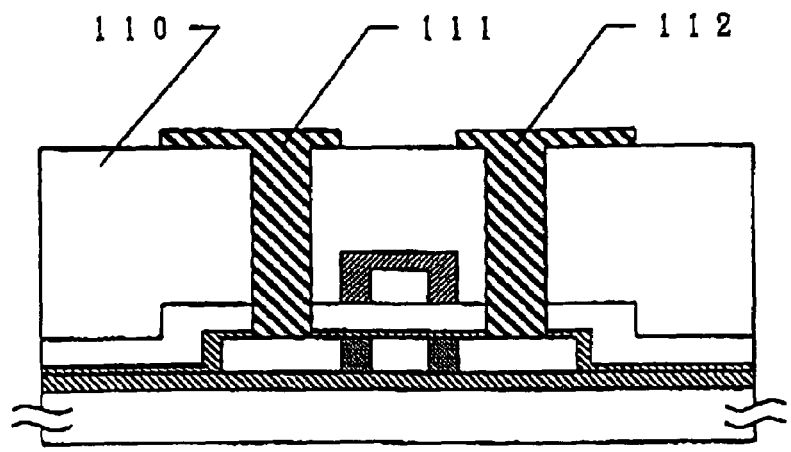

In the thin film transistor shown in FIG. 3D, the active layer comprising a source area 107, a drain area 109, and a channel formation area 108 is covered at the lower surface, the upper surface and the side surface with a thin film represented by $SiO_xN_y$ with the result that hydrogen is enclosed in the active layer and is not be diffused to the outside.

Embodiment 3

Embodiment 3 is characterized by allowing the active layer 103 to contain hydrogen by heat treatment in the atmosphere of hydrogen in place of hydrogen ion doping at the fabrication step (FIG. 3A) in the embodiment 2.

The heat treatment in which the active layer 103 is allowed to contain hydrogen can be performed by heating at 300 to 500° C. in a mixed atmosphere of 100% of hydrogen and an inert atmosphere.

Embodiment 4

Embodiment 4 is characterized by allowing the active layer 103 to contain hydrogen by exposing the active layer 103 to a hydrogen plasma in place of hydrogen ion doping at the fabrication step (FIG. 3A).

This hydrogen plasma treatment is carried out by arranging a specimen in the state shown in FIG. 3A in the atmosphere of reduced pressure of hydrogen and giving a high frequency energy to the atmosphere. In this hydrogen plasma treatment, it is effective to heat the specimen to about 300 to 500° C.

Embodiment 5

Embodiment 5 is concerned with a structure in which a gate insulating film is sandwiched between a thin film represented by $SiO_xN_y$ by forming the thin film represented by $SiO_xN_y$ on the gate insulating film. FIG. 4 shows the fabrication step of embodiment 5. In the beginning, on a surface of a glass substrate 401, a thin film 402 represented by $SiO_xN_y$ is formed as a base film. Here, a thin film 402 represented by $SiO_xN_y$ is formed to a thickness of 1000 Å by the plasma CVD using dichlorosilane ($SiH_2Cl_2$) as material gas.

Next, an amorphous silicon film is formed to a thickness of 1000 Å by the plasma CVD or by the low pressure thermal CVD. Then, a nickel acetate solution is coated by the spin coating process to introduce nickel element into the amorphous silicon film. Then, the amorphous silicon film is crystallized by subjecting the amorphous silicon film to four hour heat treatment at 550° C. Then, an active layer 403 comprising a crystalline silicon film is formed by patterning the amorphous silicon film. Naturally, the active layer 403 may be formed by using the amorphous silicon film, the crystalline silicon film crystallized by normal heating, and the crystalline silicon film crystallized by laser light irradiation.

When the active layer 403 is formed, the hydrogenation of the active layer 403 is carried out. This step is carried out by doping hydrogen ions into the active layer 403. This step is carried out by the ion doping process and the plasma doping process. The doping condition can be defined as follows; for example, acceleration voltage of hydrogen ions is set to 40 KeV, and the dose amount is set to $2\times10^{19}$ cm$^{-3}$. In this manner, the unpaired bond of silicon is neutralized by this hydrogen. In this manner, defects and levels in the active layer 403 can be reduced.

The step of hydrogenating the aforementioned active layer 403 can be carried out by heat treatment in the atmosphere of hydrogen. In such a case, the active layer may be subjected to heat treatment at 300 to 500° C. in the atmosphere of hydrogen in the normal pressure state or a pressured state, or in the atmosphere containing hydrogen.

After the completion of the step of hydrogenating the active layer 403, the active layer 403 is covered to form a thin film 404 represented by $SiO_xN_y$. The thin film designated by reference numeral 404 is formed by the plasma CVD using dichlorosilane ($SiH_2Cl_2$) as a material gas.

Figure 4A:
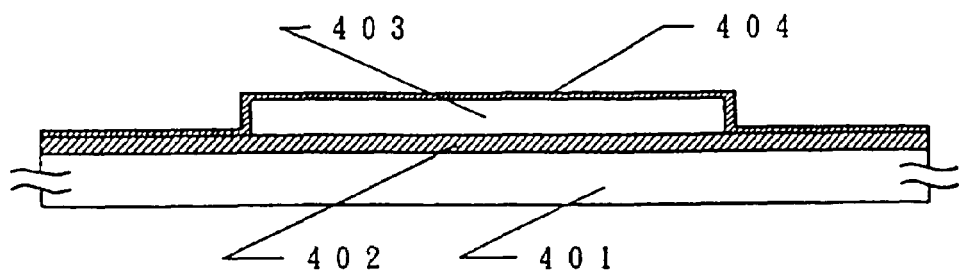
FIGS. 4A to 4C show a fabrication step according to another embodiment.

In this manner, a state shown in FIG. 4A is obtained. In this state, the active layer 403 is coated with a thin film represented by $SiO_xN_y$ at an upper surface, a lower surface and a side surface thereof. In other words, the active layer 403 is wrapped with the thin film. In such a state, the active layer 403 is hydrogenated and contains a large amount of hydrogen. Then, the thin film represented by $SiO_xN_y$ serves as a barrier for enclosing hydrogen in the active layer.

When the state shown in FIG. 4A is obtained, a film having silicon with one conductivity type as a primary component is formed by the reduced pressure thermal CVD process to a thickness of 5000 Å. Here, an N-type crystalline silicon film is formed. Then, the crystalline silicon film is patterned to form a gate electrode 406. Then, the gate electrode 406 is used as a mask to dope impurity ions by the ion doping process and the plasma doping process. As impurity ions, phosphorus is used to form an N-type thin film transistor. When a P-type thin film transistor is used, boron is used. Here, phosphorus ions are doped by the ion doping process to form an N-channel type thin-film transistor.

At the aforementioned ion doping step, the source area 408 and the drain area 410 are formed in self-alignment. At the same time, laser light is applied for the annealing (recrystallization) of the active layer non-crystallized by the ion impact and the activation of doped impurity ions. As the laser light, for example, XeCl excimer laser is used. At this step, the source area 408 and the drain area 410 are recrystallized and impurity ions doped in these areas are activated.

After the completion of the step of the laser light irradiation for the annealing and activation of the source/drain areas, a thin film 407 represented by $SiO_xN_y$ is formed. The thin film 407 represented by $SiO_xN_y$ is formed by the plasma CVD using dichlorosilane.

Figure 4B:
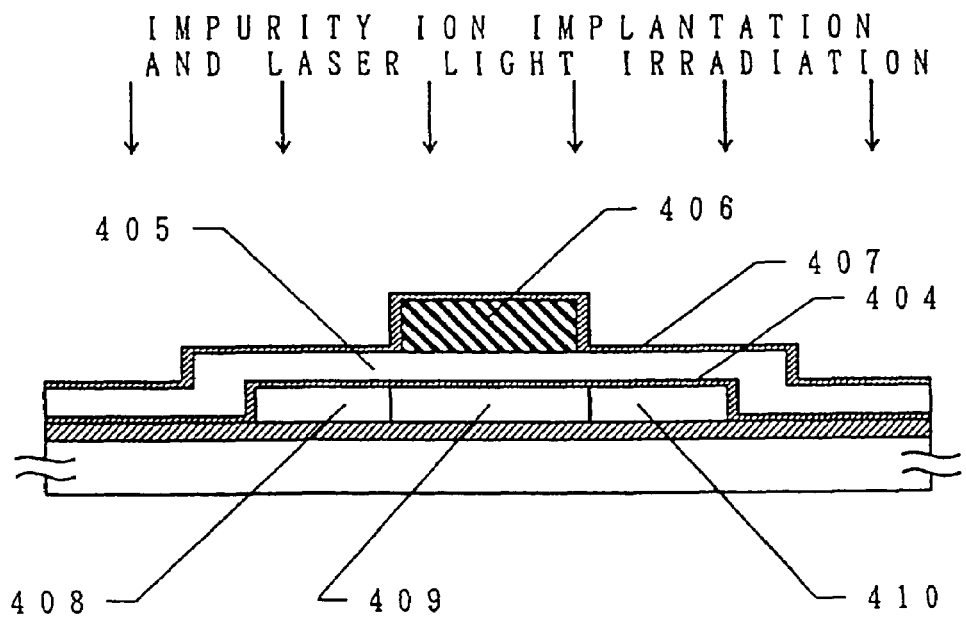

Then, a state shown in FIG. 4B is obtained. After that, a silicon oxide film is formed as an interlayer insulating film 411. At this time, the intrusion of hydrogen into the gate insulating film 405 is prevented by the operation of thin film 407 represented by $SiO_xN_y$.

Figure 4C:
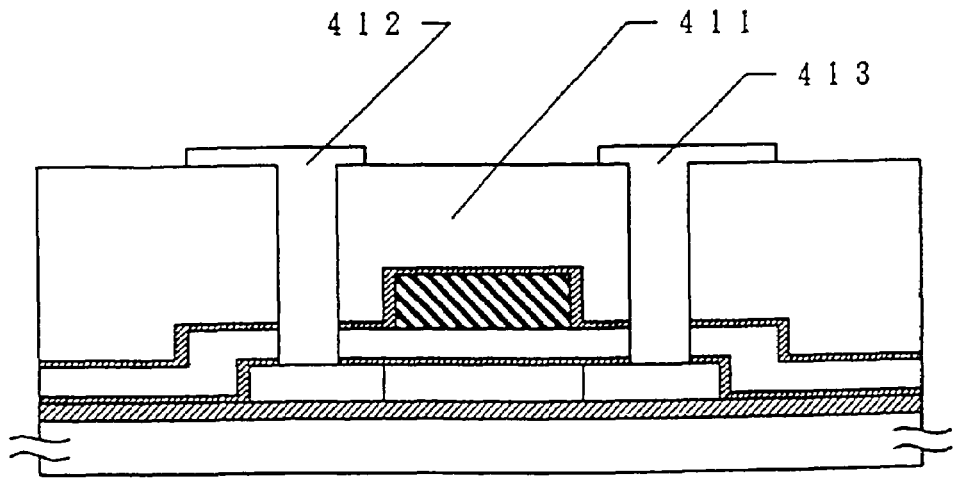

Then, a source electrode 412 and a drain electrode 413 are formed after the completion of the hole drilling step. The source/drain electrodes may be formed by using an appropriate metal such as aluminum or the like. In this manner, a thin film transistor is completed as shown in FIG. 4C.

Embodiment 6

Figure 5A:
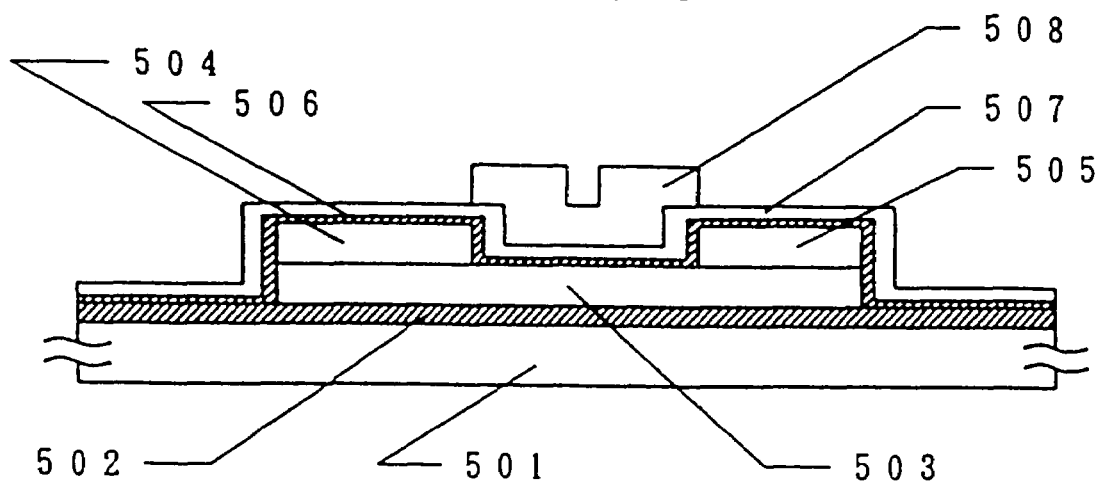
FIGS. 5A and 5B show a fabrication step according to another embodiment.

Embodiment 6 is an example in which the invention disclosed in this specification is employed in a structure shown in FIG. 5A. The thin film transistor shown in FIG. 5A is formed on a glass substrate 501. The embodiment shown in FIG. 5A has a thin film 502 represented by $SiO_xN_y$ constituting a base film formed on a glass substrate 501, a semiconductor layer 503 constituting a channel formation area, a source area 504 and a drain area 505 which are semiconductor layers having one conductivity type, a thin film 506 represented by $SiO_xN_y$, a gate insulating film 507 comprising a silicon oxide film and a gate electrode 508.

The semiconductor layer 503 is crystallized by the action of the catalyst action which promotes the crystallization. The semiconductor layer 503 which constitutes a channel formation area, the semiconductor layer 504 constituting a source area, and the semiconductor layer 505 constituting a drain area can enclose in themselves hydrogen and a metal element promoting crystallization because the thin film 502 represented by $SiO_xN_y$ is formed on the lower surface and the thin film 506 represented by $SiO_xN_y$ is formed on the upper surface and the side surface. Then hydrogen and the metal element present in the active layer can be prevented from intruding the gate insulating film 507.

Embodiment 7

Figure 5B:
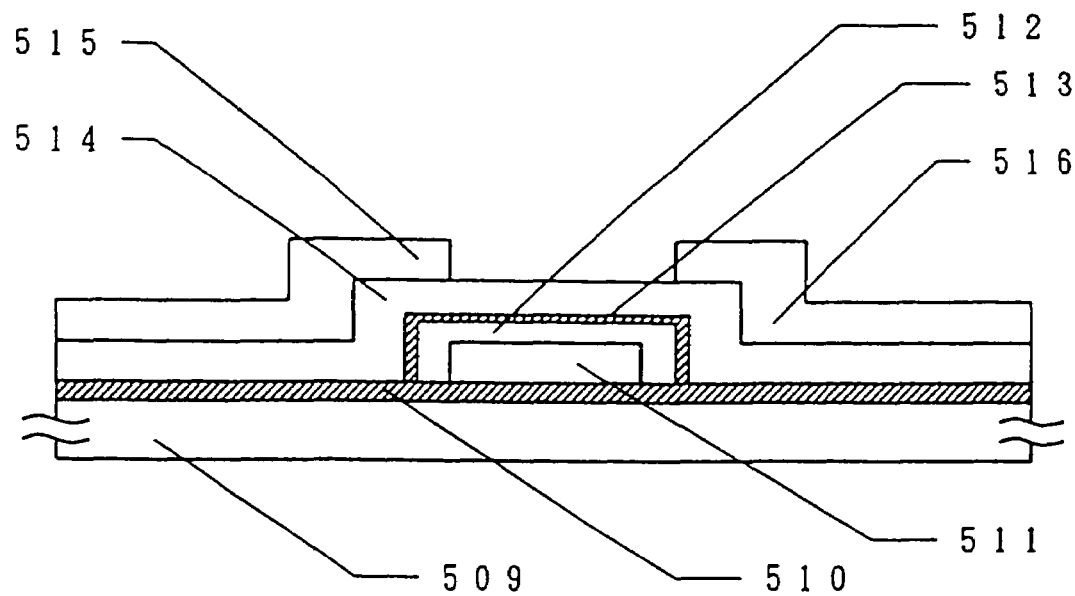

Embodiment 7 is an example in which the invention disclosed in this specification is used in a structure shown in FIG. 5B. The thin film transistor shown in FIG. 5B is formed on the glass substrate 509. Embodiment 7 shown in FIG. 5B has a thin film 510 represented by $SiO_xN_y$ constituting a base film formed on the glass substrate 509, a gate electrode 511, a gate insulating film 512 comprising silicon oxide, a thin film 513 represented by $SiO_xN_y$, a semiconductor layer 515 constituting a source area, and a semiconductor layer 516 constituting a drain area.

The semiconductor layer 514 comprises an amorphous silicon film. In a structure shown in FIG. 5B, since the periphery of the gate insulating film 512 is covered with the thin film transistor represented by $SiO_xN_y$, the embodiment can be constituted so that hydrogen does not intrude the gate insulating film 512 from the semiconductor layer 514. In particular, when the amorphous silicon film is used as the semiconductor layer 514, a large amount of hydrogen is contained in the semiconductor layer 514. Consequently, it is important to prevent hydrogen from intruding the gate insulating film 512 with the action of the thin film 513 represented by $SiO_xN_y$.

Hydrogen can be contained in the active layer, and hydrogen is not contained in the gate insulating film as much as possible at the same time by using the invention disclosed in this specification. Thus, a high performance thin-film transistor excellent in electric stability can be obtained.

What is claimed is:

1. A semiconductor device comprising:
   a gate electrode formed over a substrate;
   a gate insulating film formed over the gate electrode, the gate insulating film including a first insulating layer comprising silicon oxide over the gate electrode and a second insulating layer comprising SiOxNy where x and y are 0<x<2, 0<y<4/3 over the first insulating layer; and
   a semiconductor layer formed over the gate insulating film,
   wherein a nitrogen concentration of the first insulating layer is smaller than a nitrogen concentration of the second insulating layer.

2. A semiconductor device according to claim 1, wherein the second insulating layer includes chlorine at a concentration of $1 \times 10^{15}$ to $1 \times 10^{20}$ cm$^{-3}$.

3. A semiconductor device according to claim 1, wherein the second insulating layer has a band gap of 5.3 to 7.0 eV.

4. A semiconductor device according to claim 1, wherein the first insulating layer and the second insulating layer are stacked in this order over the gate electrode.

5. A semiconductor device comprising:
   a gate electrode formed over a substrate;
   a gate insulating film formed over the gate electrode, the gate insulating film including a first insulating layer comprising silicon oxide over the gate electrode and a second insulating layer comprising SiOxNy where x and y are 0<x<2, 0<y<4/3 over the first insulating layer; and
   an amorphous semiconductor layer formed over the gate insulating film;
   wherein a nitrogen concentration of the first insulating layer is smaller than a nitrogen concentration of the second insulating layer.

6. A semiconductor device according to claim 5, wherein the second insulating layer includes chlorine at a concentration of $1 \times 10^{15}$ to $1 \times 10^{20}$ cm$^{-3}$.

7. A semiconductor device according to claim 5, wherein the second insulating layer has a band gap of 5.3 to 7.0 eV.

8. A semiconductor device according to claim 5, wherein the first insulating layer and the second insulating layer are stacked in this order over the gate electrode.

9. A semiconductor device comprising:
   a gate electrode formed over a substrate;
   a gate insulating film formed over the gate electrode, the gate insulating film including a first insulating layer comprising silicon oxide over the gate electrode and a second insulating layer comprising SiOxNy where x and y are 0<x<2, 0<y<4/3 over the first insulating layer; and
   an amorphous semiconductor film formed over the gate insulating film; and
   a semiconductor layer comprising a source area and a semiconductor layer comprising a drain area formed over the amorphous semiconductor film, wherein a nitrogen concentration of the first insulating layer is smaller than a nitrogen concentration of the second insulating layer.

10. A semiconductor device according to claim 9, wherein the second insulating layer includes chlorine at a concentration of $1\times10^{15}$ to $1\times10^{20}$ cm$^{-3}$.

11. A semiconductor device according to claim 9, wherein the second insulating layer has a band gap of 5.3 to 7.0 eV.

12. A semiconductor device according to claim 9, wherein the first insulating layer and the second insulating layer are stacked in this order over the gate electrode.

13. A semiconductor device according to claim 1, wherein the semiconductor layer includes a fine crystal silicon film.

14. A semiconductor device comprising:
a gate electrode formed over a substrate;
a gate insulating film formed over the gate electrode, the gate insulating film including a first insulating layer containing silicon and oxygen over the gate electrode and a second insulating layer containing silicon and oxygen over the first insulating layer; and
a semiconductor layer formed over the gate insulating film,
wherein a nitrogen concentration of the first insulating layer is smaller than a nitrogen concentration of the second insulating layer.

15. A semiconductor device according to claim 14, wherein the second insulating layer includes chlorine at a concentration of $1\times10^{15}$ to $1\times10^{20}$ cm$^{-3}$.

16. A semiconductor device according to claim 14, wherein the second insulating layer has a band gap of 5.3 to 7.0 eV.

17. A semiconductor device according to claim 14, wherein the first insulating layer and the second insulating layer are stacked in this order over the gate electrode.

18. A semiconductor device according to claim 14, wherein the semiconductor layer includes a fine crystal silicon film.

19. A semiconductor device comprising:
a gate electrode formed over a substrate;
a gate insulating film formed over the gate electrode, the gate insulating film including a first insulating layer containing silicon and oxygen over the gate electrode and a second insulating layer containing silicon and oxygen over the first insulating layer; and
an amorphous semiconductor layer formed over the gate insulating film;
wherein a nitrogen concentration of the first insulating layer is smaller than a nitrogen concentration of the second insulating layer.

20. A semiconductor device according to claim 19, wherein the second insulating layer includes chlorine at a concentration of $1\times10^{15}$ to $1\times10^{20}$ cm$^{-3}$.

21. A semiconductor device according to claim 19, wherein the second insulating layer has a band gap of 5.3 to 7.0 eV.

22. A semiconductor device according to claim 19, wherein the first insulating layer and the second insulating layer are stacked in this order over the gate electrode.

23. A semiconductor device comprising:
a gate electrode formed over a substrate;
a gate insulating film formed over the gate electrode, the gate insulating film including a first insulating layer containing silicon and oxygen over the gate electrode and a second insulating layer containing silicon and oxygen over the first insulating layer;
an amorphous semiconductor film formed over the gate insulating film; and
a semiconductor layer comprising a source area and a semiconductor layer comprising a drain area formed over the amorphous semiconductor film,
wherein a nitrogen concentration of the first insulating layer is smaller than a nitrogen concentration of the second insulating layer.

24. A semiconductor device according to claim 23, wherein the second insulating layer includes chlorine at a concentration of $1\times10^{15}$ to $1\times10^{20}$ cm$^{-3}$.

25. A semiconductor device according to claim 23, wherein the second insulating layer has a band gap of 5.3 to 7.0 eV.

26. A semiconductor device according to claim 23, wherein the first insulating layer and the second insulating layer are stacked in this order over the gate electrode.

* * * * *